(12) United States Patent
Lin et al.

(10) Patent No.: US 10,090,154 B1
(45) Date of Patent: Oct. 2, 2018

(54) METHOD FOR PREPARING A SEMICONDUCTOR STRUCTURE HAVING SECOND LINE PATTERNS AND THIRD LINE PATTERNS FORMED OVER FIRST LINE PATTERNS

(71) Applicant: NANYA TECHNOLOGY CORPORATION, New Taipei (TW)

(72) Inventors: Jeng-Ping Lin, Taoyuan (TW); Chiang-Lin Shih, New Taipei (TW); Shing-Yih Shih, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 0 days.

(21) Appl. No.: 15/853,411

(22) Filed: Dec. 22, 2017

Related U.S. Application Data

(62) Division of application No. 15/656,668, filed on Jul. 21, 2017.

(51) Int. Cl.
  *H01L 21/033* (2006.01)
  *H01L 27/108* (2006.01)

(52) U.S. Cl.
  CPC ...... *H01L 21/0338* (2013.01); *H01L 21/0332* (2013.01); *H01L 21/0335* (2013.01); *H01L 21/0337* (2013.01); *H01L 27/10805* (2013.01); *H01L 27/10894* (2013.01); *H01L 27/10897* (2013.01)

(58) Field of Classification Search
  CPC ............ H01L 21/0338; H01L 21/0332; H01L 21/0335; H01L 21/0337; H01L 27/10805; H01L 27/10894; H01L 27/10897
  See application file for complete search history.

(56) References Cited

U.S. PATENT DOCUMENTS

| | | | |
|---|---|---|---|
| 8,026,044 B2 * | 9/2011 | Lee ...................... | H01L 21/0337 430/270.1 |
| 2010/0279472 A1 * | 11/2010 | Tsai .................... | H01L 27/0207 438/128 |
| 2011/0052883 A1 * | 3/2011 | Jain ........................ | G03F 7/2022 428/195.1 |
| 2014/0327087 A1 * | 11/2014 | Kim ................... | H01L 27/10826 257/392 |
| 2015/0179513 A1 * | 6/2015 | Myers ............... | H01L 21/76879 257/774 |
| 2015/0371685 A1 * | 12/2015 | Shin .................... | H01L 29/0649 257/506 |

(Continued)

*Primary Examiner* — Khiem D Nguyen
(74) *Attorney, Agent, or Firm* — Muncy, Geissler, Olds & Lowe, P.C.

(57) ABSTRACT

The present disclosure provide a method for preparing a semiconductor structure. The semiconductor structure includes a substrate having a memory array region and a peripheral circuit region; a plurality of first line patterns positioned in the memory array region and extending along a first direction; a plurality of second line patterns positioned over the first line patterns in the memory array region; and a plurality of linear features positioned in the peripheral circuit region. The plurality of second line patterns extend along a second direction different from the first direction. The plurality of second line patterns and the plurality of linear features are positioned at substantially the same level in the substrate.

9 Claims, 15 Drawing Sheets

(56) References Cited

U.S. PATENT DOCUMENTS

2016/0181101 A1\* 6/2016 Yun .................. H01L 27/11524
　　　　　　　　　　　　　　　　　　　　257/522
2016/0293419 A1 　10/2016 Nam
2017/0025284 A1\* 　1/2017 Kang .................. H01L 21/0337

\* cited by examiner

METHOD FOR PREPARING A SEMICONDUCTOR STRUCTURE HAVING SECOND LINE PATTERNS AND THIRD LINE PATTERNS FORMED OVER FIRST LINE PATTERNS

PRIORITY CLAIM AND CROSS-REFERENCE

This patent application is a divisional application of and claims priority to U.S. patent application Ser. No. 15/656,668, filed on Jul. 21, 2017, which is incorporated by reference in its entirety.

TECHNICAL FIELD

The present disclosure relates to a semiconductor structure and a method for preparing the same.

DISCUSSION OF THE BACKGROUND

As the integration density of semiconductor devices increases, the lithographic process requires higher resolution to meet the precision requirements of the semiconductor devices. Photolithography process is typically used to fabricate electronic and optoelectronic devices on a semiconductor substrate and photoresist patterns prepared by the photolithography process are used as masks in etching or ion implantation. Therefore, the fineness of the photoresist patterns is a very important factor in determining the degree of integration.

One method to increase resolution is to use a light source with a shorter wavelength as the exposure light source. For example, a krypton fluoride (KrF) laser is used to provide deep UV light with a wavelength of 248 nanometers and an argon fluoride (ArF) laser is used to provide deep UV light with a wavelength of 193 nanometers. Another method of forming such fine photoresist patterns on the semiconductor substrate is through double patterning technique. In a double patterning process, a pattern from a first exposure may be etched onto a photoresist layer on the semiconductor substrate, and the semiconductor substrate is subsequently recoated with the photoresist layer to form a second pattern and then re-etched to obtain the desired pattern. However, the double patterning technique requires that the exposure process be performed twice, which requires very precise alignment between the two exposure processes.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

One aspect of the present disclosure provides a semiconductor structure comprising: a substrate having a memory array region and a peripheral circuit region; a plurality of first line patterns positioned in the memory array region and extending along a first direction; a plurality of second line patterns positioned over the first line patterns in the memory array region, wherein the plurality of second line patterns extend along a second direction different from the first direction; a plurality of third line patterns disposed over the first line patterns in the memory array region, wherein the plurality of second line patterns and the plurality of third line patterns are disposed over the first line pattern in an alternate manner; and a plurality of linear features positioned in the peripheral circuit region; wherein the plurality of second line patterns, the plurality of third line patterns, and the plurality of linear features are positioned at substantially the same level in the substrate.

In some embodiments, the peripheral circuit region is in the absence of the first line patterns.

In some embodiments, the plurality of linear features in the peripheral circuit region are integrally formed with the plurality of second line patterns in the memory array region.

In some embodiments, the plurality of linear features in the peripheral circuit region are integrally formed with the plurality of third line patterns in the memory array region.

Another aspect of the present disclosure provides a semiconductor structure comprising a substrate having a memory array region and a peripheral circuit region; a plurality of island patterns positioned in the memory array region; and a plurality of linear features in the peripheral circuit region; wherein the plurality of island patterns and the plurality of linear features are positioned at substantially different levels in the substrate.

In some embodiments, the plurality of island patterns are positioned in the memory array region in an array manner, wherein the array extends along a first direction and a second direction substantially not perpendicular to the first direction.

In some embodiments, the plurality of linear features extend along the first direction in the peripheral circuit region.

In some embodiments, the plurality of island patterns are positioned at a first level, the plurality of linear features are positioned at a second level, and the first level is substantially lower than the second level in the substrate.

Another aspect of the present disclosure provides a method for preparing a semiconductor structure, comprising: forming a plurality of linear core patterns and a plurality of linear spacer patterns on a substrate, wherein the plurality of linear spacer patterns are formed on sidewalls of the linear core patterns; removing the plurality of linear core patterns from the substrate; removing a portion of the substrate not covered by the plurality of linear spacer patterns to form a plurality of first line patterns, wherein the plurality of first line patterns extend along a first direction; performing a first litho-etch process to form a plurality of second line patterns over the first line patterns, wherein the plurality of second line patterns extend along a second direction different from the first direction; and performing a second litho-etch process to form a plurality of third line patterns over the first line patterns, wherein the plurality of second line patterns and the plurality of third line patterns are formed over the first line pattern in an alternate manner.

In some embodiments, the second direction is substantially not perpendicular to the first direction.

In some embodiments, the plurality of first line patterns are formed in a mask layer of the substrate, and a patterning process is performed using the plurality of second line patterns and the plurality of third line patterns to pattern the plurality of first line patterns into a plurality of island patterns.

In some embodiments, the method further comprises performing an etching process using the plurality of island patterns as an etching mask to remove a portion of a target layer under the mask layer.

In some embodiments, the substrate comprises a memory array region and a peripheral circuit region, and the first litho-etch process and the second litho-etch process are performed to form the plurality of second line patterns and the plurality of third line patterns in the memory array region and a plurality of linear features in the peripheral circuit region.

In some embodiments, the plurality of linear features in the peripheral circuit region are integrally formed with the plurality of second line patterns in the memory array region.

In some embodiments, the plurality of linear features in the peripheral circuit region are integrally formed with the plurality of third line patterns in the memory array region.

In some embodiments, the substrate comprises a memory array region and a peripheral circuit region, the plurality of first line patterns are formed in the memory array region, and the peripheral circuit region is in the absence of the first line patterns.

In some embodiments, the forming of the plurality of linear core patterns comprises performing an immersion-litho process.

In some embodiments, the forming of the plurality of first line patterns comprises performing an etching process using the plurality of linear spacer patterns as an etching mask.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

A more complete understanding of the present disclosure may be derived by referring to the detailed description and claims when considered in connection with the Figures, where like reference numbers refer to similar elements throughout the Figures, and:

DETAILED DESCRIPTION

The following description of the disclosure accompanies drawings, which are incorporated in and constitute a part of this specification, and illustrate embodiments of the disclosure, but the disclosure is not limited to the embodiments. In addition, the following embodiments can be properly integrated to complete another embodiment.

References to "one embodiment," "an embodiment," "exemplary embodiment," "other embodiments," "another embodiment," etc. indicate that the embodiment(s) of the disclosure so described may include a particular feature, structure, or characteristic, but not every embodiment necessarily includes the particular feature, structure, or characteristic. Further, repeated use of the phrase "in the embodiment" does not necessarily refer to the same embodiment, although it may.

The present disclosure is directed to a semiconductor structure and a method for preparing the same. In order to make the present disclosure completely comprehensible, detailed steps and structures are provided in the following description. Obviously, implementation of the present disclosure does not limit special details known by persons skilled in the art. In addition, known structures and steps are not described in detail, so as not to unnecessarily limit the present disclosure. Preferred embodiments of the present disclosure are described in detail below. However, in addition to the detailed description, the present disclosure may also be widely implemented in other embodiments. The scope of the present disclosure is not limited to the detailed description, but is defined by the claims.

Figure 1:
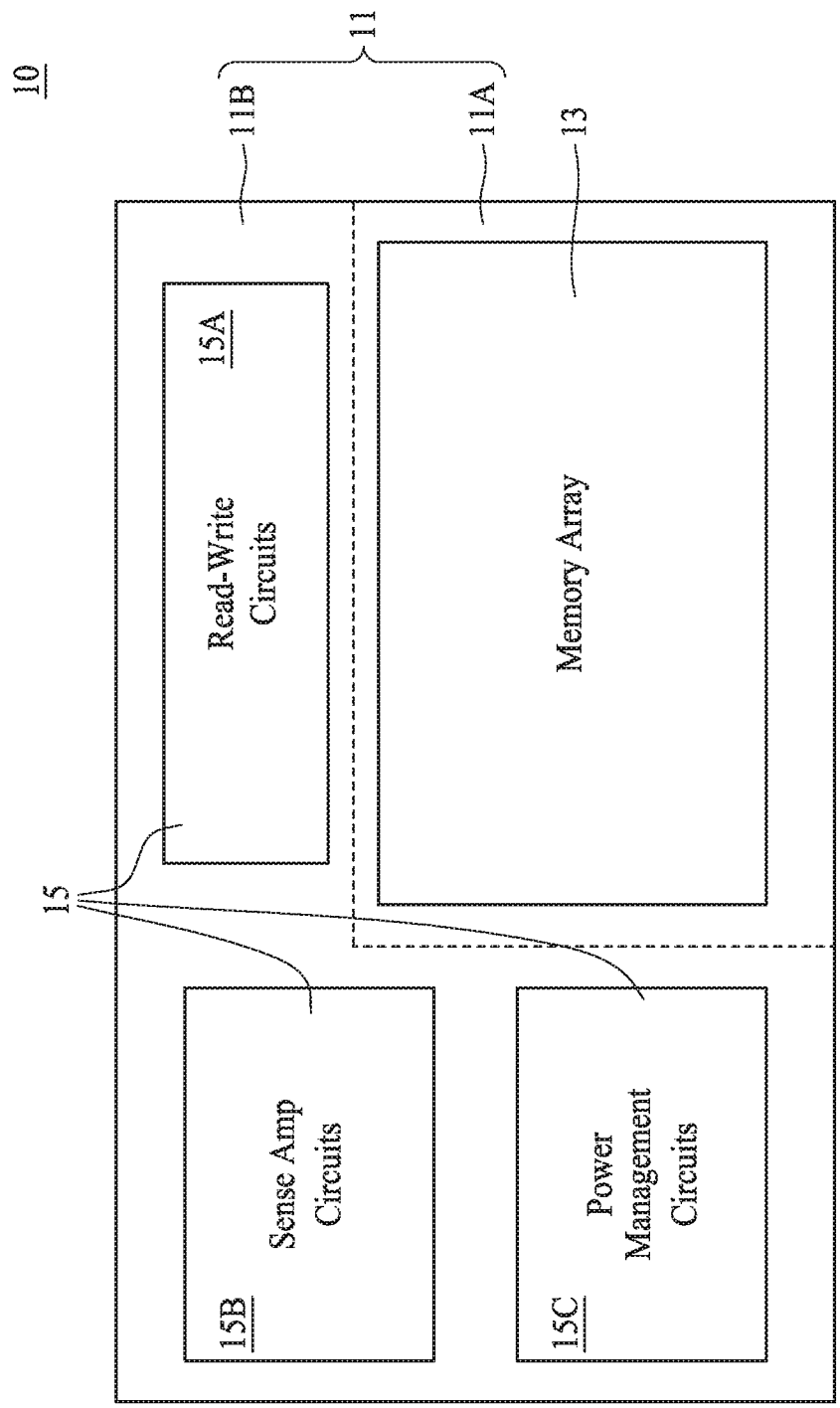
FIG. 1 is a schematic layout of a DRAM memory device having a memory array region and a peripheral circuit region in accordance with some embodiments of the present disclosure.

A variety of semiconductor memory devices are used extensively in many consumer products. Illustrative examples of such memory devices include dynamic random access memory (DRAM) and flash memory devices. FIG. 1 is a schematic layout of a DRAM memory device 10 having a memory array region 11A and a peripheral circuit region 11B in accordance with some embodiments of the present disclosure. In general, the memory device 10 comprises a memory array 13 in the memory array region 11A and a plurality of peripheral circuits 15 in the peripheral circuit region 11B. By way of example only, a plurality of schematically depicted illustrative peripheral circuits 15 are depicted in FIG. 1. More specifically, the illustrative peripheral circuits 15 comprise read-write circuits 15A, sense amp circuits 15B and power management circuits 15C. The illustrative peripheral circuits depicted in FIG. 1 do not comprise an exhaustive set of all such peripheral circuits 15 on the memory device 10. In other words, the peripheral circuit 15 may comprise any circuitry on the memory device 10 including those other than the circuitry found within the memory array 13.

The memory array 13 includes a multitude of memory cells arranged in rows and columns. Each of the memory cells is structured for storing digital information in the form of a logical high (i.e., a "1") or a logical low (i.e., a "0"). To write (i.e., store) a bit into a memory cell, a binary address having portions identifying the cell's row (the "row address") and column (the "column address") is provided to addressing circuitry in the memory device 10 to activate the cell, and the bit is then supplied to the cell. Similarly, to read (i.e., retrieve) a bit from a memory cell, the cell is again activated using the cell's memory address and the bit is then output from the cell.

Figure 2:
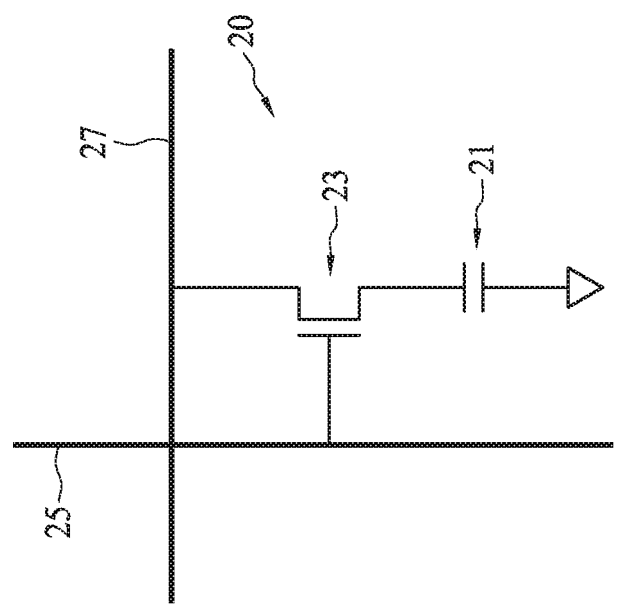
FIG. 2 depicts a schematic diagram of a DRAM memory cell in accordance with some embodiments of the present disclosure.

FIG. 2 depicts a schematic diagram of a DRAM memory cell 20 in accordance with some embodiments of the present disclosure. The memory cell 20 comprises a capacitor 21 and a transistor 23. The capacitor 21 can store charge, which represents one bit of information. The transistor 23 acts as a switch, which controls the flow of charge into or out of the capacitor 21. The control gate of the transistor 23 is coupled to a word line 25, and the drain of the transistor 23 is coupled to a bit line 27. When a cell is read, the transistor 23 is activated through the word line 25, and the charge in the capacitor 21 can be detected by a sense amplifier through the bit line 27 and processed to determine the bit state of the cell 20. A typical memory array 13 contains thousands or millions of cells 20.

Figure 3:
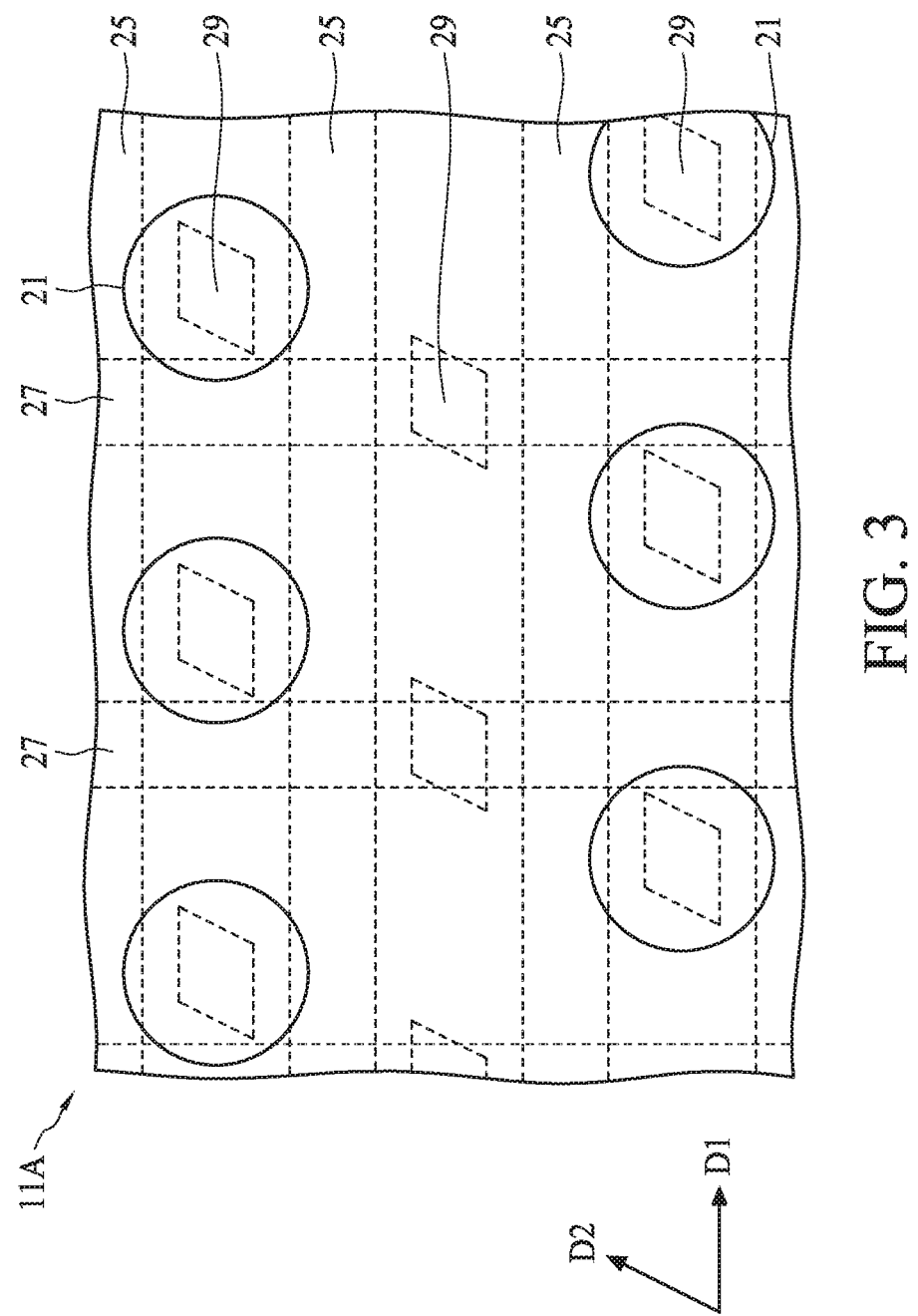
FIG. 3 schematically depicts the top view of the memory array region in accordance with some embodiments of the present disclosure.

FIG. 3 schematically depicts the top view of the memory array region 11A in accordance with some embodiments of the present disclosure. As shown in FIG. 3, the memory array region 11A comprises a plurality of active areas 31, a plurality of word lines 25 formed between corresponding active areas 29, a plurality of bit lines 27 coupled to a portion of active areas 29, and a plurality of capacitors 21 coupled with other portions of active areas 29. In some embodiments, the plurality of active areas 29 are island patterns positioned in the memory array region 11A in an array manner, and the array extends along a first direction D1 and a second direction D2 substantially not perpendicular to the first direction.

Figure 4:
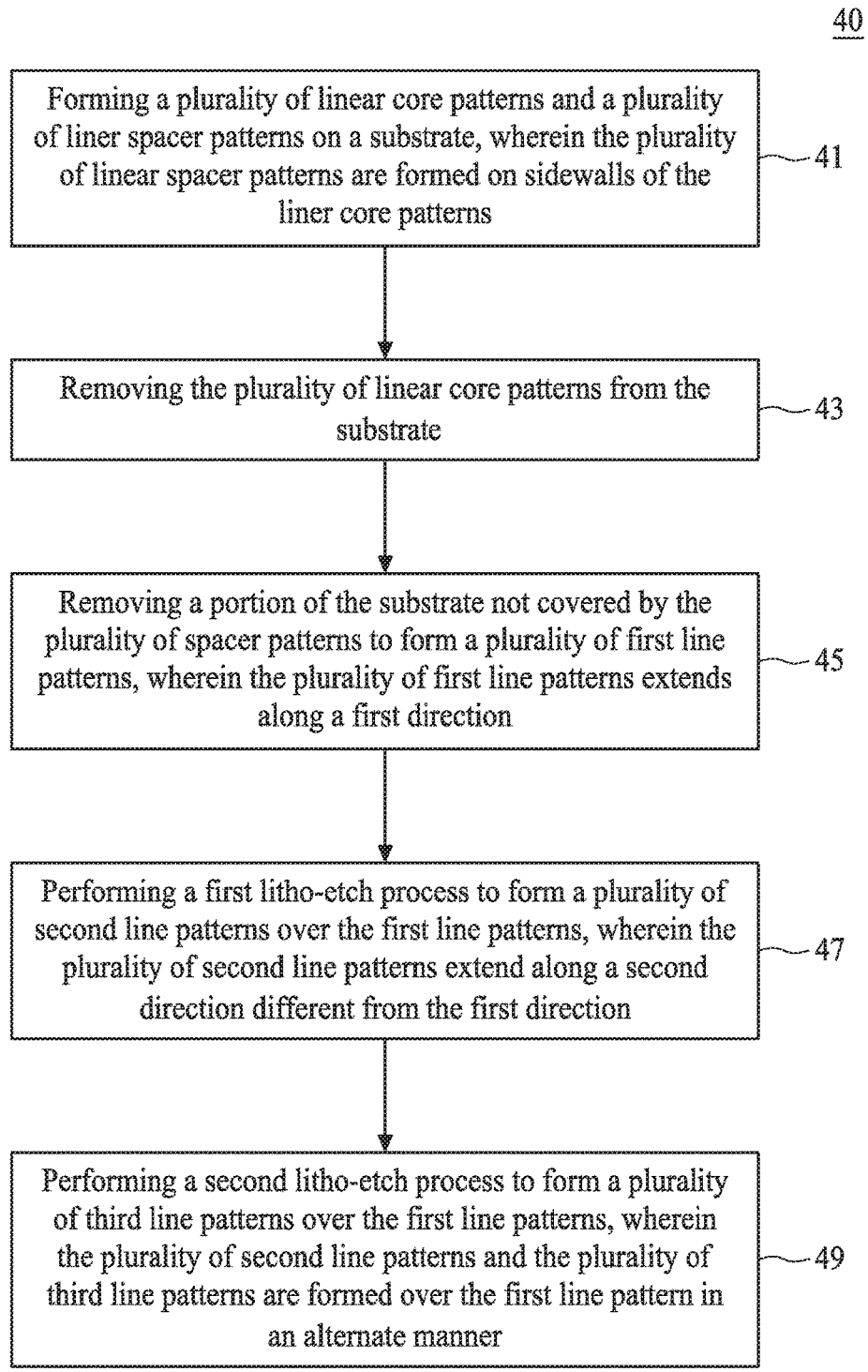
FIG. 4 is a flow chart of the method for preparing a semiconductor structure in accordance with some embodiments of the present disclosure.

FIG. 4 is a flow chart of the method 40 for preparing a semiconductor structure in accordance with some embodiments of the present disclosure. The method 40 comprises a step 41 of forming a plurality of linear core patterns and a plurality of linear spacer patterns on a substrate, wherein the plurality of linear spacer patterns are formed on sidewalls of the linear core patterns; a step 43 of removing the plurality of linear core patterns from the substrate; a step 45 of removing a portion of the substrate not covered by the plurality of linear spacer patterns to form a plurality of first line patterns, wherein the plurality of first line patterns extend along a first direction; a step 47 of performing a first litho-etch process to form a plurality of second line patterns over the first line patterns, wherein the plurality of second line patterns extend along a second direction different from the first direction; and a step 49 of performing a second litho-etch process to form a plurality of third line patterns over the first line patterns, wherein the plurality of second line patterns and the plurality of third line patterns are formed over the first line pattern in an alternate manner.

The following describes an exemplary process flow of the injection molding simulation method 40 in accordance with some embodiments of the present disclosure. FIGS. 5 to 29 are schematic views of a process for preparing the semiconductor structure by the method 40 in FIG. 4 in accordance with some embodiments of the present disclosure.

Figure 5:
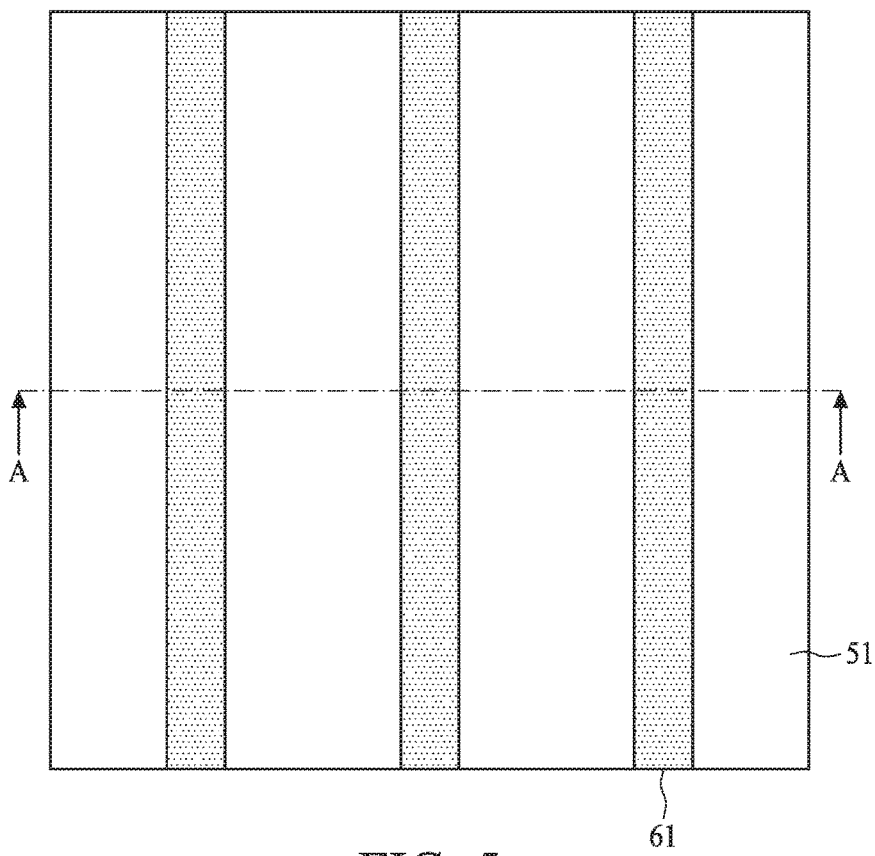
FIGS. 5 to 29 are schematic views of a process for preparing the semiconductor structure by the method in FIG. 4 in accordance with some embodiments of the present disclosure.
Figure 6:
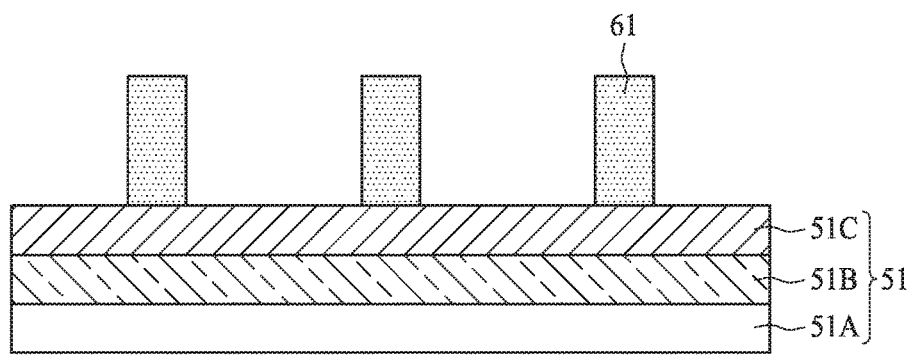

In step 41 of the method 40, a plurality of linear core patterns 61 and a plurality of linear spacer patterns 65 are formed on a substrate 51, as shown in FIGS. 5 to 10. In some embodiments, referring to FIG. 5 and FIG. 6, the plurality of linear core patterns 61 are formed on the substrate 51 by deposition, lithography and etching processes. FIG. 5 is a top view of the memory array region 11A and FIG. 6 is a cross-sectional view along a cross-sectional line A-A in FIG. 5.

In some embodiments, the substrate 51 comprises a silicon wafer. In some embodiments, the substrate 51 comprises a metal layer 51A, a first layer 51B and a second layer 51C. In some embodiments, the metal layer 51A comprises tungsten (W), titanium nitride (TiN) or titanium (Ti). In some embodiments, the first layer 51B and the second layer 51C comprise different materials selected from the group consisting of silicon oxide, silicon nitride, silicon oxynitride, silicon, carbon, or the combination thereof.

Figure 7:
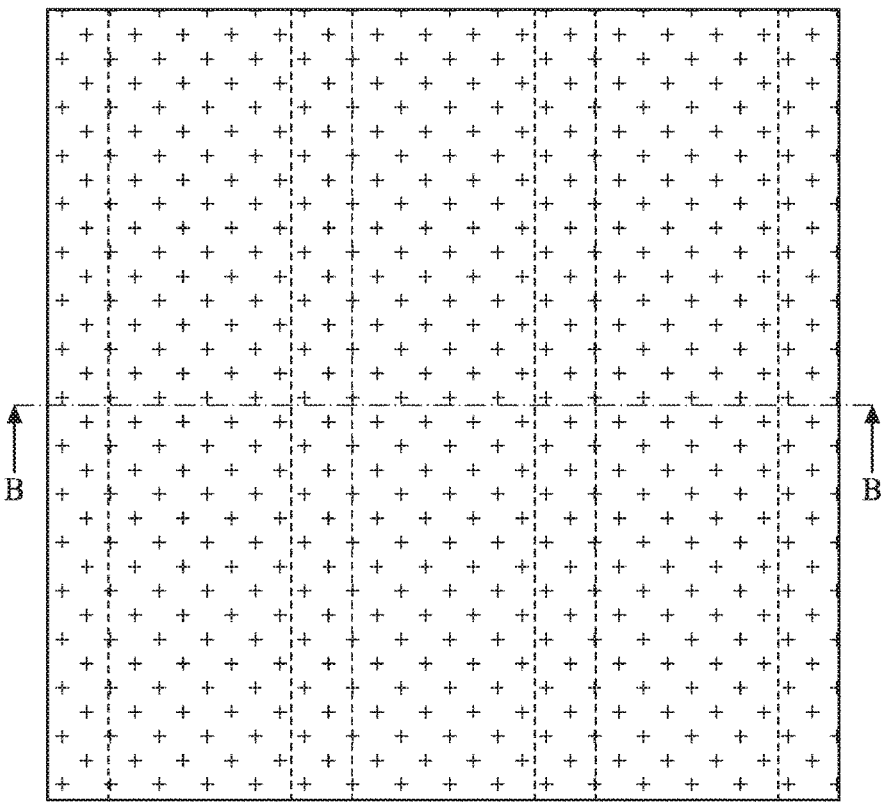
Figure 8:
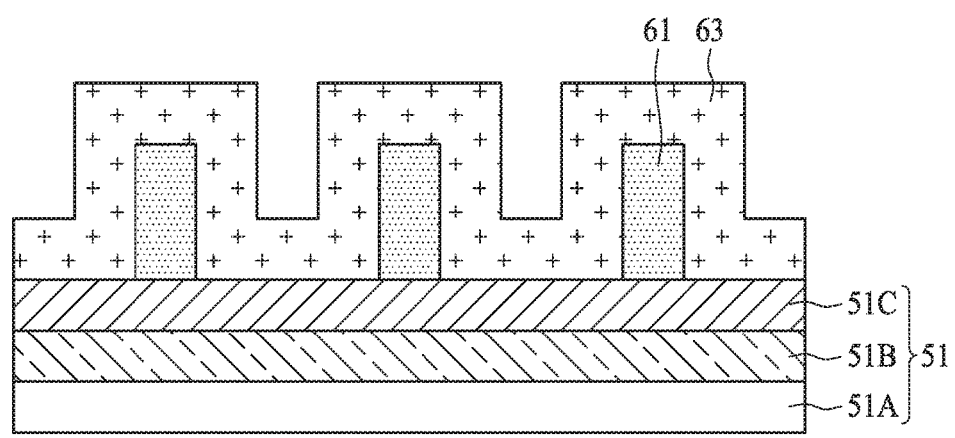

FIG. 7 is a top view of the memory array region 11A and FIG. 8 is a cross-sectional view along a cross-sectional line B-B in FIG. 7. In some embodiments, a deposition process is performed to form a dielectric layer 63 on the substrate 51. In some embodiments, the deposition process is an atomic layer deposition process, and the dielectric layer 63 covers the plurality of linear core patterns 61 and comprises materials selected from the group consisting of silicon oxide, silicon nitride and silicon oxynitride.

Figure 9:
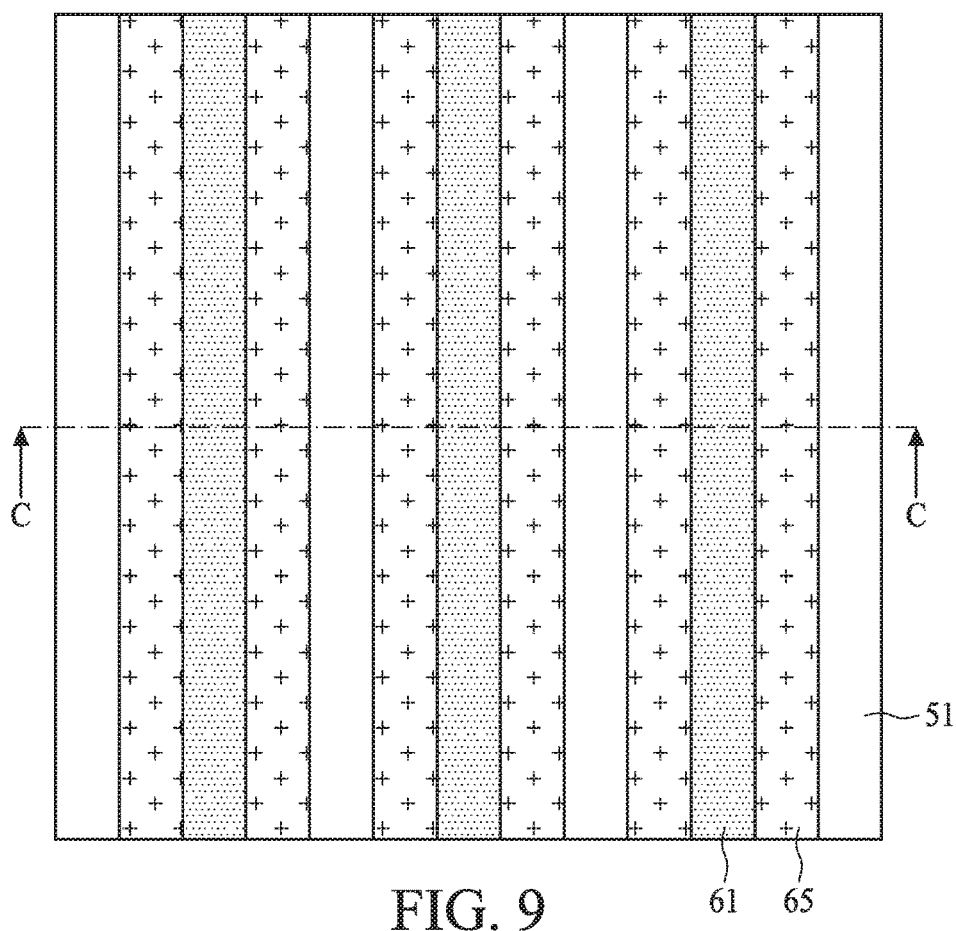
Figure 10:
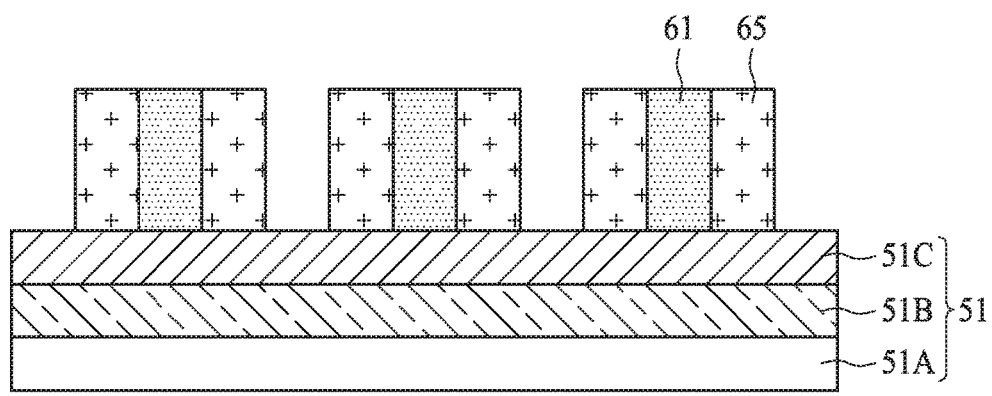

FIG. 9 is a top view of the memory array region 11A and FIG. 10 is a cross-sectional view along a cross-sectional line C-C in FIG. 9. In some embodiments, a spacer etching process is performed to remove a portion of the dielectric layer 63 so as to form the plurality of linear spacer patterns 65 on sidewalls of the linear core patterns 61.

Figure 11:
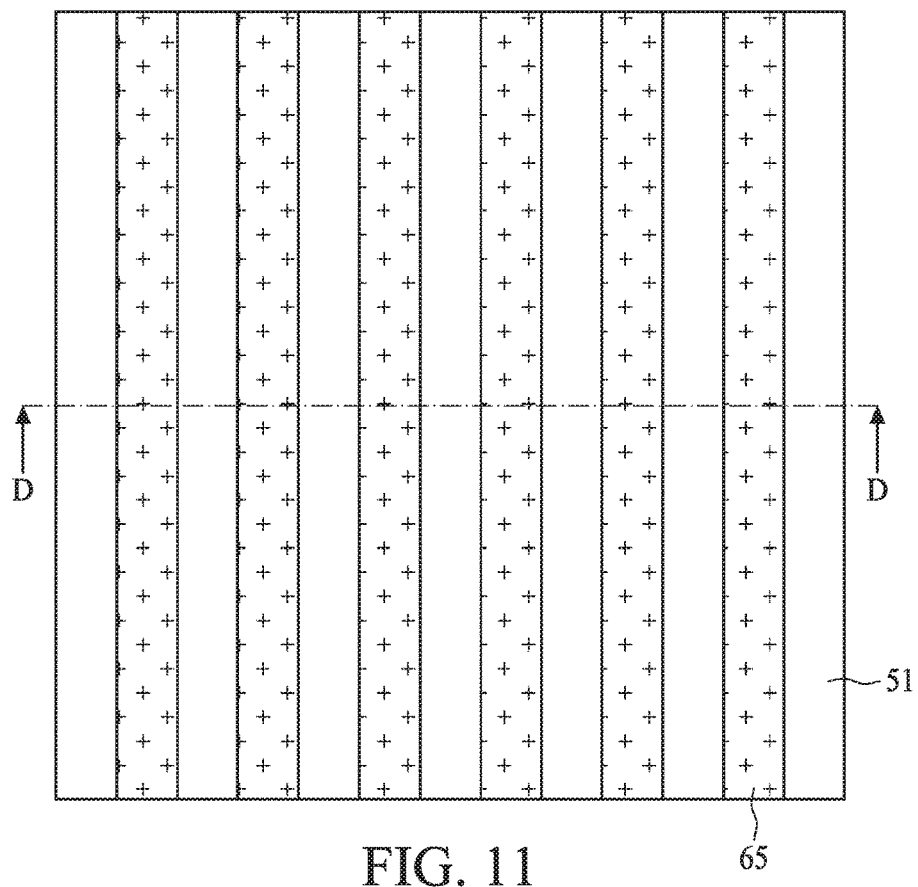
Figure 12:
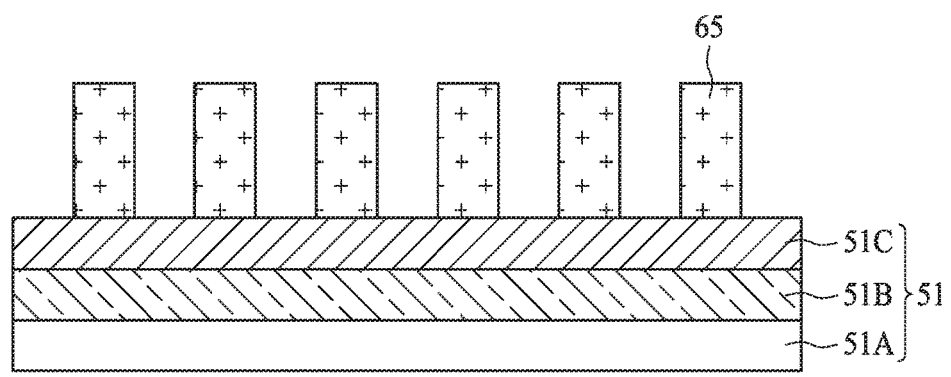

FIG. 11 is a top view of the memory array region 11A and FIG. 12 is a cross-sectional view along a cross-sectional line D-D in FIG. 11. In step 43 of the method 40, the plurality of linear core patterns 61 are removed from the substrate 51. The space between the linear spacer patterns 65 in FIG. 12 is smaller than the space between the linear core patterns 61 in FIG. 6. In some embodiments, the space between the linear spacer patterns 65 in FIG. 12 is half of the space between the linear core patterns 61 in FIG. 6.

Figure 13:
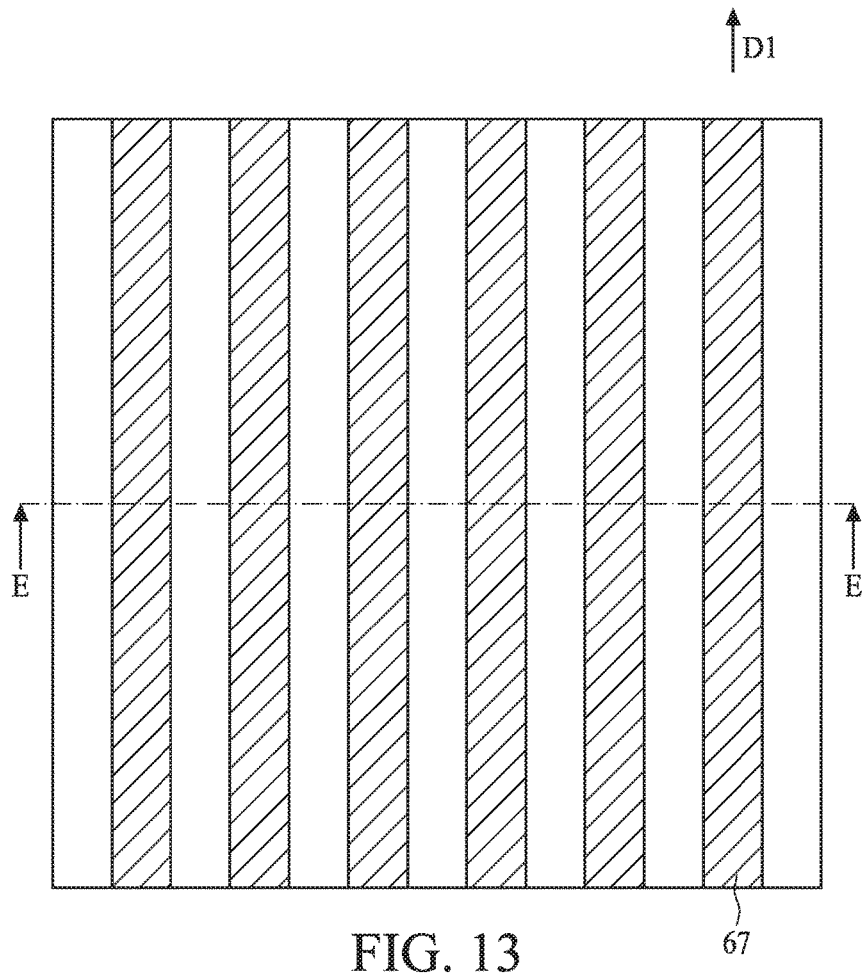
Figure 14:
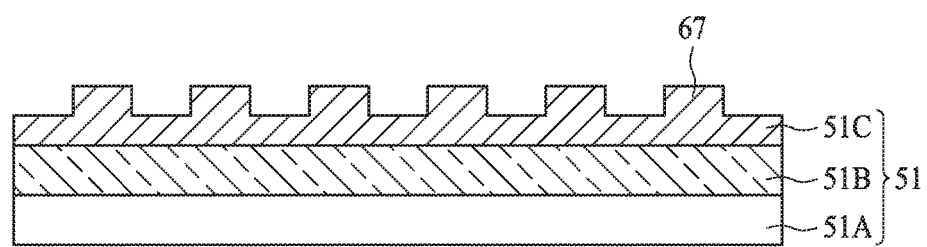

FIG. 13 is a top view of the memory array region 11A and FIG. 14 is a cross-sectional view along a cross-sectional line E-E in FIG. 13. In step 45 of the method 40, a portion of the substrate 51 not covered by the plurality of linear spacer patterns 65 is removed to form a plurality of first line patterns 67, wherein the plurality of first line patterns 67 extend along a first direction D1. In some embodiments, an etching process is performed using the linear spacer patterns 65 as etching masks to remove a portion of the second layer 51C not covered by the plurality of linear spacer patterns 65, so as to form the plurality of first line patterns 67 under the linear spacer patterns 65, which are then stripped from the substrate 51. In some embodiments, the plurality of first line patterns 67 are formed in the memory array region 11A; in other words, the peripheral circuit region 11B is in the absence of the first line patterns 37.

Figure 16:
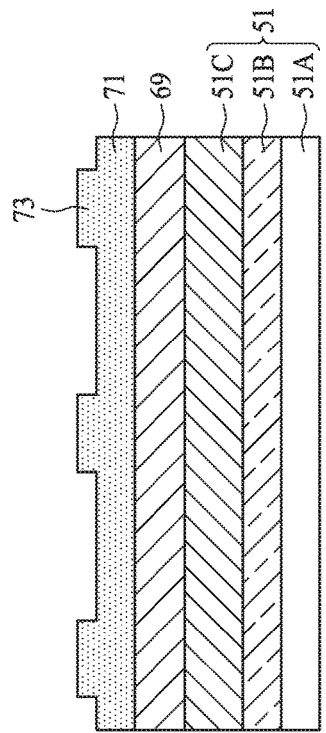
Figure 17:
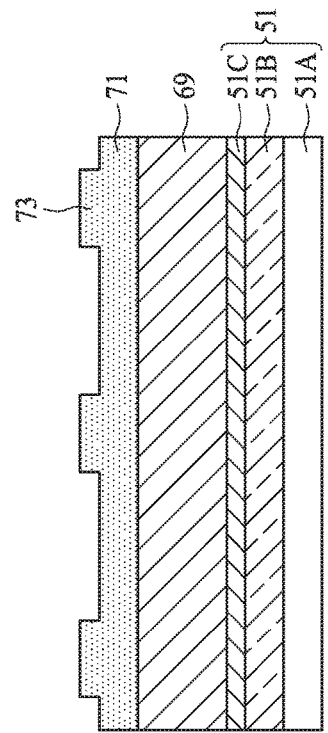
Figure 15:
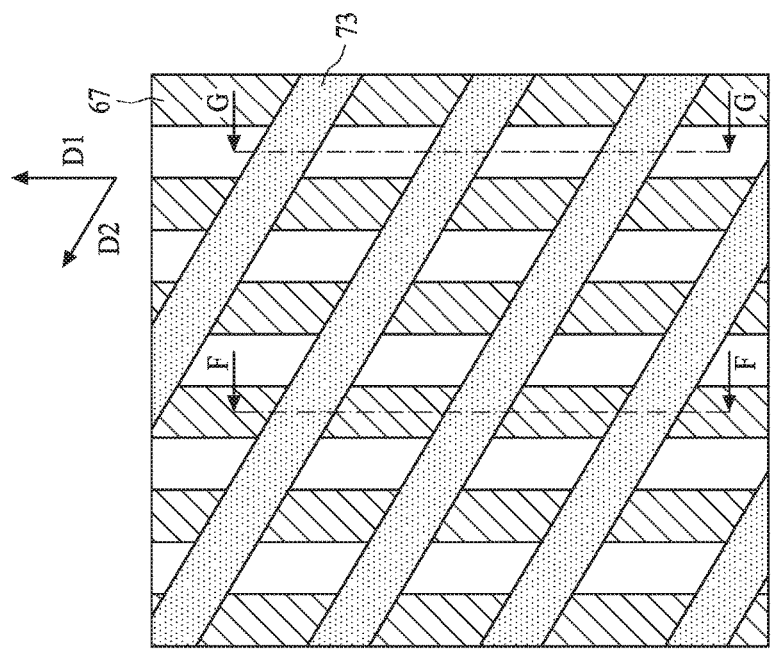

FIG. 15 is a top view of the memory array region 11A, FIG. 16 is a cross-sectional view along a cross-sectional line F-F in FIG. 15, and FIG. 17 is a cross-sectional view along a cross-sectional line G-G in FIG. 15. In some embodiments, a third layer 69 and a fourth layer 71 are formed on the substrate 51 by deposition process. In step 47 of the method 40, a first litho-etch process is performed to remove a portion of the fourth layer 71, so as to form a plurality of second line patterns 73 over the first line patterns 67. In some embodiments, the plurality of second line patterns 73 extend along a second direction D2 different from the first direction D1. In some embodiments, the second direction D2 is substantially not perpendicular to the first direction D1. In some embodiments, the first litho-etch process includes forming a patterned photoresist layer by lithography and performing an etching process using the patterned photoresist layer as an etching mask to remove a portion of the fourth layer 71 not covered by the etching mask.

Figure 18:
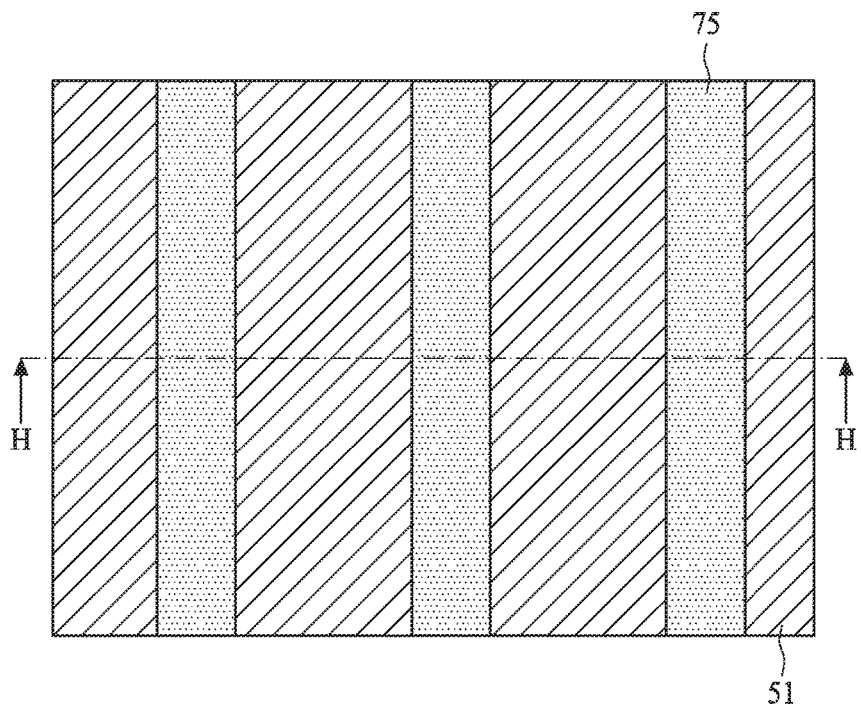
Figure 19:
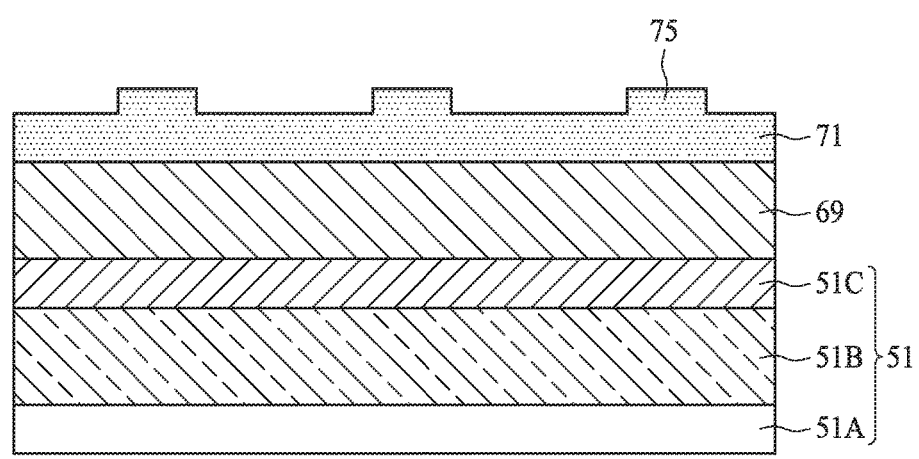

FIG. 18 is a top view of the peripheral circuit region 11B and FIG. 19 is a cross-sectional view along a cross-sectional line H-H in FIG. 18. In some embodiments, in step 47 of the method 40, the first litho-etch process also forms a plurality of linear features 75 in the peripheral circuit region 11B; in other words, the plurality of linear features 75 in the peripheral circuit region 11B are integrally formed with the plurality of second line patterns 73 in the memory array region 11A. In some embodiments, the corresponding elements of the linear features 75 and the second line patterns 73 are formed substantially by the same fabrication process, and have substantially the same physical and chemical properties as they are integrally formed with each other.

Figure 21:
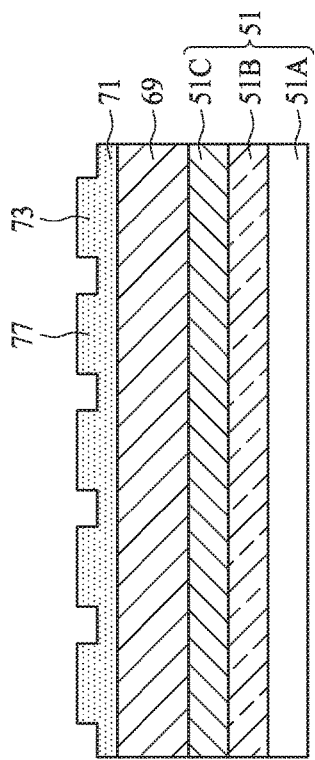
Figure 22:
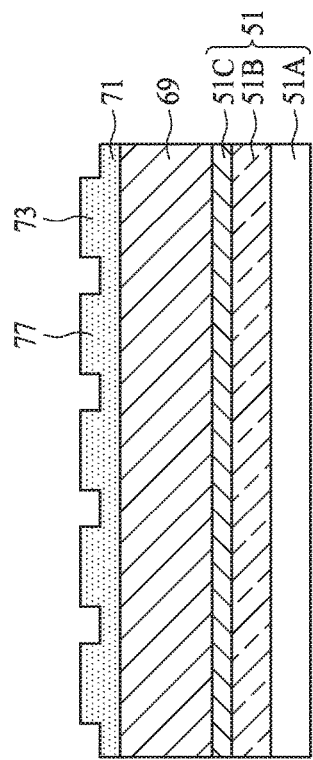
Figure 20:
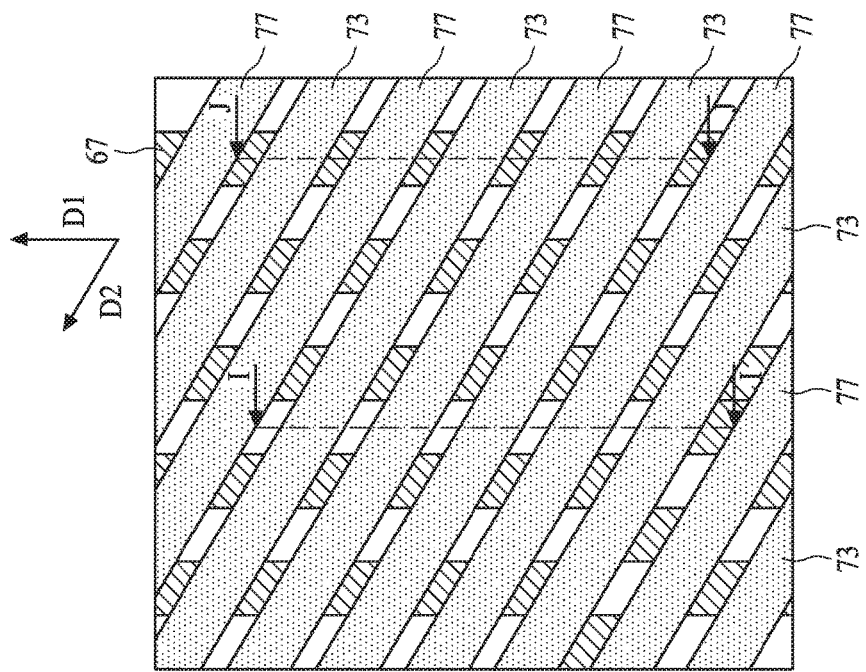

FIG. 20 is a top view of the memory array region 11A, FIG. 21 is a cross-sectional view along a cross-sectional line I-I in FIG. 20, and FIG. 21 is a cross-sectional view along a cross-sectional line J-J in FIG. 20. In some embodiments, in step 49 of the method 40, a second litho-etch process is performed to remove a portion of the fourth layer 71 to form a plurality of third line patterns 77 over the first line patterns 67. In some embodiments, the plurality of third line patterns 77 extend along the second direction D2 different from the first direction D1. In some embodiments, the plurality of second line patterns 73 and the plurality of third line patterns 77 are formed over the first line patterns 67 in an alternate manner. In some embodiments, the second litho-etch process includes forming a patterned photoresist layer by lithography and performing an etching process using the patterned photoresist layer as an etching mask to remove a portion of the fourth layer 71 not covered by the etching mask.

Figure 23:
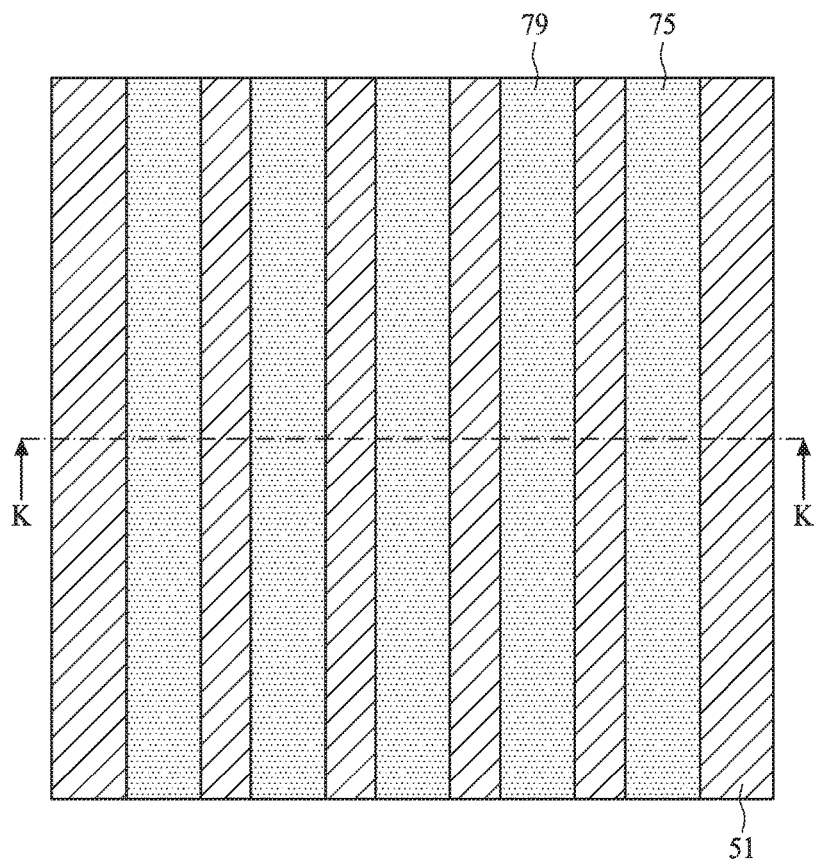
Figure 24:
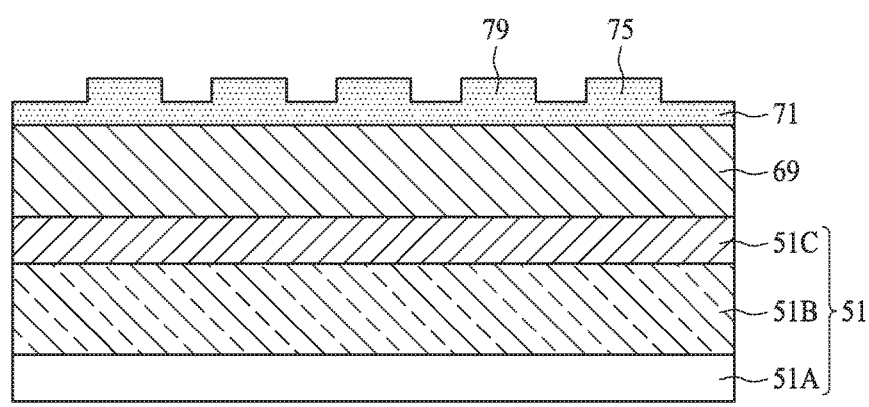
Figure 26:
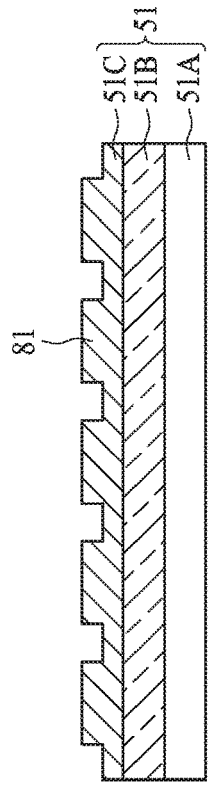
Figure 27:
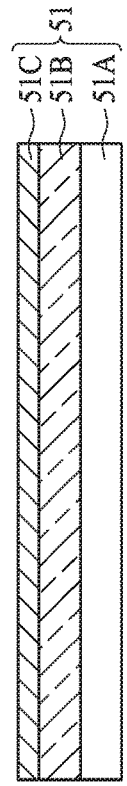

FIG. 23 is a top view of the peripheral circuit region 11B and FIG. 24 is a cross-sectional view along a cross-sectional line K-K in FIG. 23. In some embodiments, in step 49 of the method 40, the second litho-etch process also forms a plurality of linear features 79 in the peripheral circuit region 11B; in other words, the plurality of linear features 79 in the peripheral circuit region 11B are integrally formed with the plurality of third line patterns 77 in the memory array region 11A. In some embodiments, the plurality of second line patterns 73, the plurality of third line patterns 77, and the plurality of linear features 75, 79 are positioned at substantially the same level in the substrate 51. In some embodiments, the corresponding elements of the linear features 79 and the third line patterns 77 are formed substantially by the same fabrication process, and have substantially the same physical and chemical properties as they are integrally formed with each other.

Figure 28:
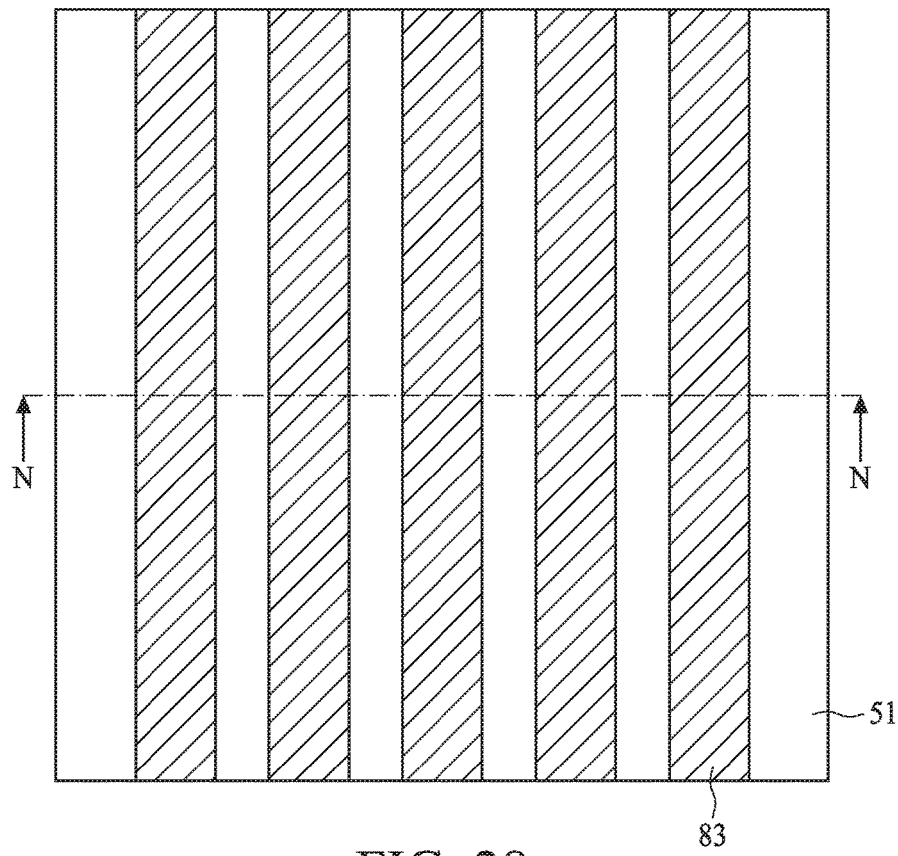
Figure 29:
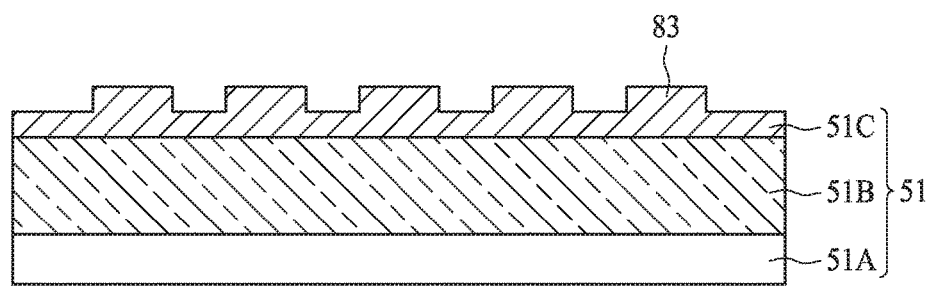

FIG. 20 is a top view of the memory array region 11A, FIG. 21 is a cross-sectional view along a cross-sectional line L-L in FIG. 20, and FIG. 21 is a cross-sectional view along a cross-sectional line M-M in FIG. 20. FIG. 28 is a top view of the peripheral circuit region 11B and FIG. 29 is a cross-sectional view along a cross-sectional line N-N in FIG. 28. In some embodiments, an etching process is performed to using the patterned fourth layer 71 to pattern the third layer 69 in the memory array region 11A and in the peripheral circuit region 11B. Subsequently, another etching process is performed using the patterned third layer 69 to pattern the second layer 51C in the memory array region 11A and in the peripheral circuit region 11B, so as to form a plurality of island patterns 81 in the memory array region 11A and a plurality of linear features 83 in the peripheral circuit region 11B.

Figure 25:
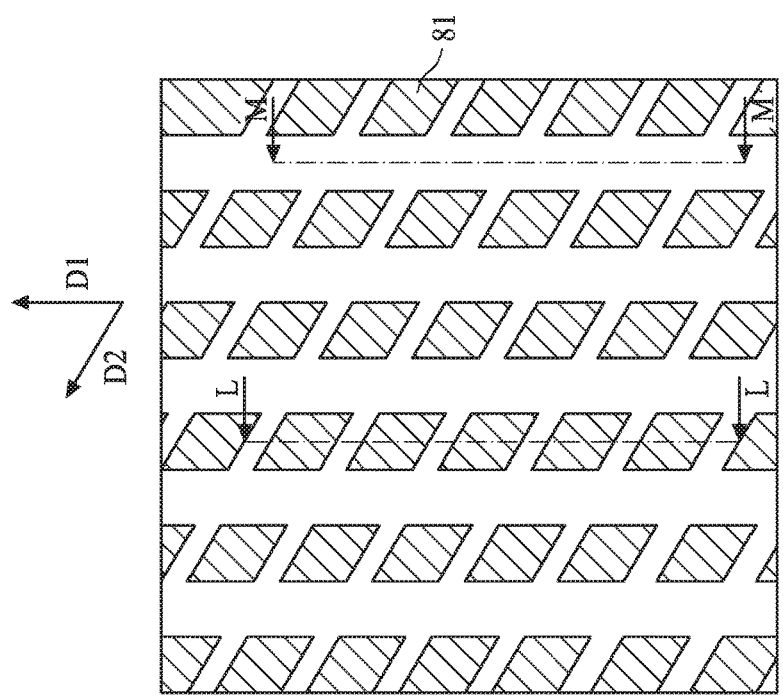

Referring to FIG. 13 and FIG. 25, the plurality of first line patterns 67 are formed in the second layer (mask layer) 51C of the substrate, and the two-etch process serves as a patterning process using the plurality of second line patterns 73 and the plurality of third line patterns 77 to pattern the plurality of first line patterns 67 into the plurality of island patterns 81 in the memory array region 11A.

In some embodiments, the plurality of island patterns 81 and the plurality of linear features 83 are positioned at substantially different levels in the substrate 51. In some embodiments, the plurality of island patterns 81 are positioned at a first level, the plurality of linear features 83 are positioned at a second level, and the first level is substantially lower than the second level in the substrate 51. In some embodiments, the island patterns 81 are active areas positioned in the memory array region 11A in an array manner, the array extends along the first direction D1 and the second direction D2 substantially not perpendicular to the first direction D1. In some embodiments, the plurality of linear features 83 extend along the first direction D1 in the peripheral circuit region 11B.

In some embodiments, a semiconductor structure includes a substrate having a memory array region and a peripheral circuit region; a plurality of first line patterns positioned in the memory array region and extending along a first direction; a plurality of second line patterns positioned over the first line patterns in the memory array region; and a plurality of linear features positioned in the peripheral circuit region. In some embodiments, the plurality of second line patterns extend along a second direction different from the first direction. In some embodiments, the plurality of second line patterns and the plurality of linear features are positioned at substantially the same level in the substrate.

In some embodiments, a semiconductor structure includes a substrate having a memory array region and a peripheral circuit region; a plurality of island patterns positioned in the memory array region; and a plurality of linear features in the peripheral circuit region. In some embodiments, the plurality of island patterns and the plurality of linear features are positioned at substantially different levels in the substrate.

In some embodiments, a method for preparing a semiconductor structure comprises forming a plurality of linear core patterns and a plurality of linear spacer patterns on a substrate, wherein the plurality of linear spacer patterns are formed on sidewalls of the linear core patterns. In some embodiments, the method removes the plurality of linear core patterns from the substrate, and then removes a portion of the substrate not covered by the plurality of linear spacer patterns to form a plurality of first line patterns, wherein the plurality of first line patterns extend along a first direction. Subsequently, the method performs a first litho-etch process to form a plurality of second line patterns over the first line patterns, and performs a second litho-etch process to form a plurality of third line patterns over the first line patterns, wherein the plurality of second line patterns and the plurality of third line patterns are formed over the first line pattern in an alternate manner. In some embodiments, the plurality of second line patterns extend along a second direction different from the first direction.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods, or steps.

What is claimed is:

1. A method for preparing a semiconductor structure, comprising:

forming a plurality of linear core patterns and a plurality of linear spacer patterns on a substrate, wherein the plurality of linear spacer patterns are formed on sidewalls of the linear core patterns;

removing the plurality of linear core patterns from the substrate;

removing a portion of the substrate not covered by the plurality of linear spacer patterns to form a plurality of first line patterns, wherein the plurality of first line patterns extend along a first direction;

depositing an etched layer on the first line patterns of the substrate;

performing a first litho-etch process to remove a first surface portion of the etched layer to form a plurality of second line patterns over the first line patterns, wherein the plurality of second line patterns extend along a second direction different from the first direction; and performing a second litho-etch process to remove a second surface portion of the etched layer, which is different from the first surface portion, to form a plurality of third line patterns over the first line patterns, wherein the plurality of second line patterns and the plurality of third line patterns are formed on the etched layer and over the first line patterns in an alternate manner, wherein the plurality of second line patterns and the plurality of third line patterns are positioned at substantially the same level on the substrate.

2. The method for preparing a semiconductor structure of claim 1, wherein the second direction is substantially not perpendicular to the first direction.

3. The method for preparing a semiconductor structure of claim 1, wherein the plurality of first line patterns are formed in a mask layer of the substrate, and a patterning process is performed using the plurality of second line patterns and the plurality of third line patterns to pattern the plurality of first line patterns into a plurality of island patterns.

4. The method for preparing a semiconductor structure of claim 1, wherein the substrate comprises a first region and a second region, and the first litho-etch process and the second litho-etch process are performed to form the plurality of second line patterns and the plurality of third line patterns in the first region and a plurality of linear features in the second region.

5. The method for preparing a semiconductor structure of claim 4, wherein the plurality of linear features in the second region are integrally formed with the plurality of second line patterns in the first region.

6. The method for preparing a semiconductor structure of claim 4, wherein the plurality of linear features in the second region are integrally formed with the plurality of third line patterns in the first region.

7. The method for preparing a semiconductor structure of claim 1, wherein the substrate comprises a first region and a second region, the plurality of first line patterns are formed in the first region, and the second region is in the absence of the first line patterns.

8. The method for preparing a semiconductor structure of claim 1, wherein the forming of the plurality of first line patterns comprises performing an etching process using the plurality of linear spacer patterns as an etching mask.

9. The method for preparing a semiconductor structure of claim 1, wherein the etched layer comprises a third layer and a fourth layer disposed on the first line patterns, the third layer located between the fourth layer and the first line patterns.

* * * * *